United States Patent
Koyanagi

(10) Patent No.: US 8,102,288 B2
(45) Date of Patent: Jan. 24, 2012

(54) DATA TRANSMITTING CIRCUIT AND METHOD

(75) Inventor: Yoichi Koyanagi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 67 days.

(21) Appl. No.: 12/818,786

(22) Filed: Jun. 18, 2010

(65) Prior Publication Data

US 2010/0328118 A1    Dec. 30, 2010

(30) Foreign Application Priority Data

Jun. 29, 2009 (JP) ................. 2009-154030

(51) Int. Cl.
*H03M 9/00* (2006.01)
(52) U.S. Cl. ........................ 341/101; 341/100
(58) Field of Classification Search ........... 341/100–101
See application file for complete search history.

(56) References Cited

U.S. PATENT DOCUMENTS

| 7,091,890 B1 * | 8/2006 | Sasaki et al. | 341/100 |
| 7,164,372 B2 * | 1/2007 | Takeuchi | 341/100 |
| 7,796,063 B2 * | 9/2010 | Kim et al. | 341/100 |
| 2002/0190751 A1 | 12/2002 | Lee et al. | |
| 2006/0233172 A1 | 10/2006 | Venkata et al. | |
| 2007/0030184 A1 | 2/2007 | Nguyen et al. | |
| 2007/0237186 A1 | 10/2007 | Shumarayev et al. | |
| 2009/0080584 A1 * | 3/2009 | Hamano et al. | 375/371 |

FOREIGN PATENT DOCUMENTS

| JP | 2003-17999 | 1/2003 |
| JP | 2006-302277 | 11/2006 |
| JP | 2007-43718 | 2/2007 |
| JP | 2007-282183 | 10/2007 |

* cited by examiner

*Primary Examiner* — Khai M Nguyen
(74) *Attorney, Agent, or Firm* — Staas & Halsey LLP

(57) ABSTRACT

A data transmitting circuit that converts parallel data into serial data to output the serial data, includes a first data input port that receives first parallel data at a first data rate based on a reference input clock; a second data input port that receives second parallel data at a second data rate lower than the reference input clock, a data expansion unit that generates expanded data by expanding a bit number of the second parallel data to a bit number of the first parallel data, a serial data generation unit that performs a process for generating first serial data by performing a serial conversion on the first parallel data based on the reference input clock and a process for generating second serial data by performing a serial conversion on the expanded data, and a data output port that outputs the first serial data or the second serial data.

4 Claims, 8 Drawing Sheets

FIG.4

| DATA RATE | DATA RATE SELECTION SIGNAL | CORRESPONDENCE (INPUT OUTPUT) |
|---|---|---|
| DATA RATE #1 | 00 | #1A → XB |
| | | "0" → XA |
| DATA RATE #2 | 01 | #2A → XA |
| | | #2B → XB |
| DATA RATE #3 | 10 | #3A → XA |
| | | #3B → XB |
| DATA RATE #4 | 11 | #4A → XA |
| | | #4B → XB |

321

DATA TRANSMITTING CIRCUIT AND METHOD

CROSS-REFERENCE TO RELATED APPLICATIONS

This application is based upon and claims the benefit of priority of the prior Japanese Patent Application No. 2009-154030, filed on Jun. 29, 2009, the entire contents of which are incorporated herein by reference.

FIELD

The embodiments discussed herein are related to a data transmitting circuit having a plurality of data transfer ports.

BACKGROUND

In recent years, an LSI circuit having a large number of data transfer ports corresponding to a high-speed data transfer standard is used in server apparatuses, network apparatuses, and so forth. Examples of the high-speed data transfer standard include 10-GIGABIT ETHERNET (IEEE802.3ae standard) and PCI (Peripheral Component Interconnect)-Express.

For an LSI circuit intended for high-speed data transfer, higher speed and higher performance are sought after and, in addition, reductions in cost and power consumption are demanded. For this purpose, a data transmitting/receiving circuit is densified such that one LSI circuit includes a plurality of data transfer ports (channels).

In general, a data transmitting circuit includes a driver circuit, a PLL (Phase Locked Loop) circuit that generates a clock, and so forth. The PLL circuit occupies a large proportion of the circuit area in an LSI circuit, and also consumes high power compared to other circuits. Thus, if a PLL circuit is provided for each channel in the case where a plurality of data transfer ports are provided in one LSI circuit, the PLL circuits occupy a larger proportion of the entire area in the LSI circuit, and also consume higher power. Therefore, in a data transmitting circuit, it is common for driver circuits for a plurality of channels to share one PLL circuit.

There is proposed a deserializer circuit network for a high-speed serial data receiver on a programmable logic device integrated circuit that converts serial data into parallel data with a desired data width.

However, a conventional circuit does not transmit at a different data rate independently selected for each channel using one high-speed clock.

SUMMARY

According to a certain aspect of the invention, a circuit that converts parallel data into serial data to output the serial data, includes a first data input port that receives first parallel data at a first data rate based on a reference input clock; a second data input port that receives second parallel data at a second data rate lower than the reference input clock; a data expansion unit that generates expanded data by expanding a bit number of the second parallel data to a bit number of the first parallel data when the second parallel data is selected; a serial data generation unit that performs a process for generating first serial data by performing a serial conversion on the first parallel data based on the reference input clock when the second parallel data is selected, and a process for generating second serial data by performing a serial conversion on the expanded data based on the reference clock when the first parallel data is selected; and a data output port that outputs the first serial data or the second serial data.

The object and advantages of the invention will be realized and attained by means of the elements and combinations particularly pointed out in the claims.

It is to be understood that both the foregoing general description and the following detailed description are exemplary (used as an example) and explanatory and are not restrictive of the invention, as claimed.

BRIEF DESCRIPTION OF THE DRAWINGS

FIG. 4 illustrates an exemplary configuration of a selector table;

DESCRIPTION OF EMBODIMENTS

Figure 7:
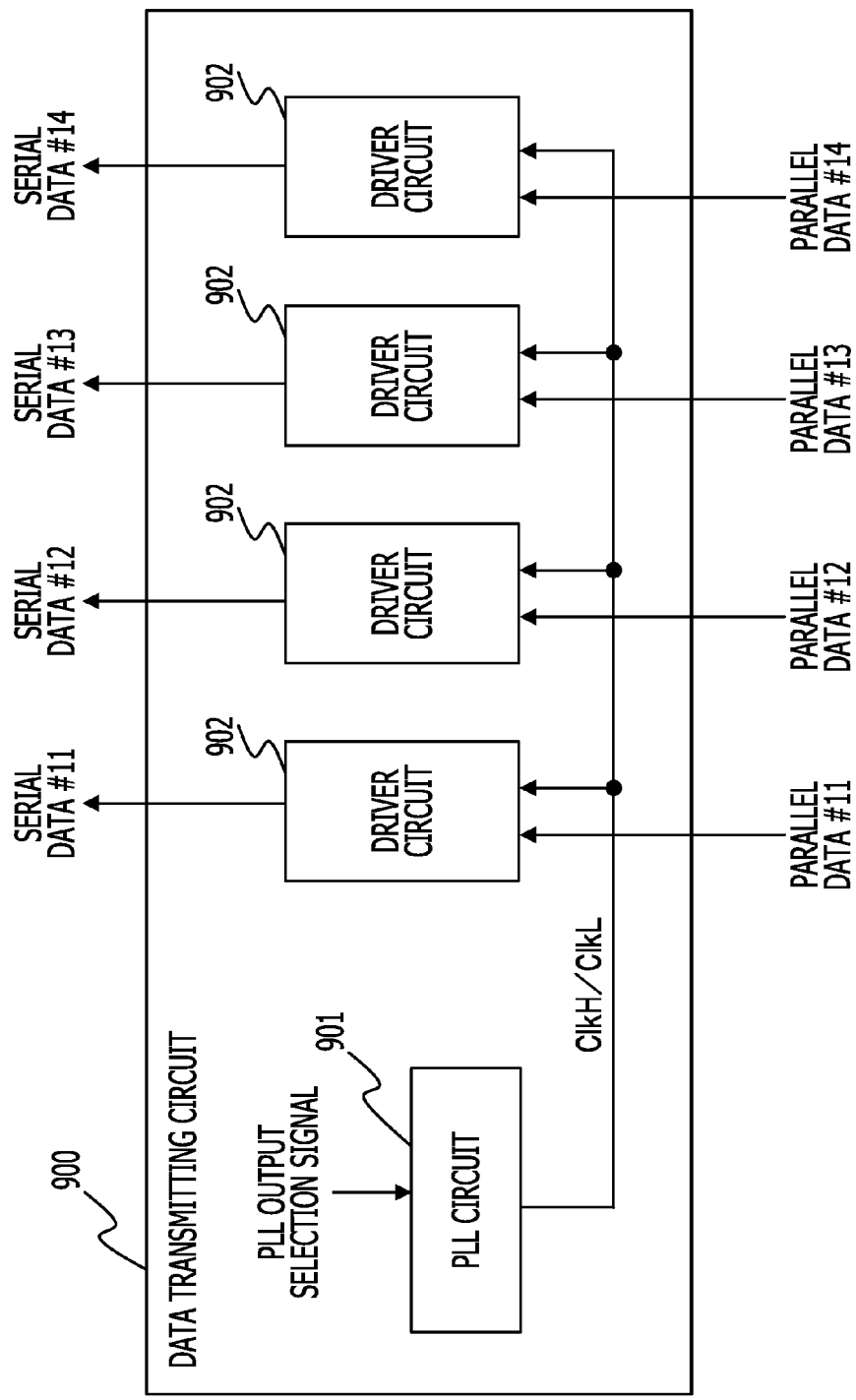
FIG. 7 illustrates an exemplary configuration of a data transmitting circuit.

A data transmitting circuit 900 illustrated in FIG. 7 includes one PLL (Phase Locked Loop) circuit 901 and a plurality of driver circuits 902.

In the data transmitting circuit 900, the driver circuits 902 respectively convert a plurality of input parallel data #11 to #14 into serial data #11 to #14 to transmit the serial data #11 to #14 obtained as a result of the conversion.

In the following description, a channel #11 refers to a channel corresponding to the conversion of input parallel data #11 into serial data #11, and the same applies to other channels #12 to #14.

The PLL circuit 901 selects either a high-speed clock ClkH or a low-speed clock ClkL in accordance with a PLL output selection signal to transmit a signal at the selected clock (ClkH/ClkL) to each of the driver circuits 902. The frequency of the high-speed clock ClkH is higher than the frequency of the low-speed clock ClkL. For example, the high-speed clock ClkH has a frequency of 10.3125 GHz/2(=5.15625 GHz), and the low-speed clock ClkL has a frequency of 1.25 GHz/2 (=0.625 GHz).

When a PLL output selection signal indicating that the high-speed clock ClkH is selected is received, the PLL circuit 901 transmits the high-speed clock ClkH (a clock of 5.15625 GHz) as the selected clock (ClkH/ClkL). On the other hand, when a PLL output selection signal indicating that the low-speed clock ClkL is selected is received, the PLL circuit 901 transmits the low-speed clock ClkL (a clock of 0.625 GHz) as the selected clock (ClkH/ClkL) to the driver circuits 902.

When parallel data #11 to #14 are received, the driver circuits 902 respectively convert the parallel data #11 to #14 into serial data #11 to #14 on the basis of the selected clock (ClkH/ClkL) to transmit the serial data #11 to #14 obtained as a result of the conversion.

The data transmitting circuit 900 has a plurality of channels #11 to #14 based on the plurality of driver circuits 902. In the data transmitting circuit 900, however, one PLL circuit 901 is shared by the plurality of channels #11 to #14, and therefore the serial data #11 to #14 for all the channels use the same data rate. That is, in the data transmitting circuit 900, it is not possible to independently select either the high-speed clock ClkH or the low-speed clock ClkL for each channel, and therefore all the channels use the data rate based on the one selected clock, namely the high-speed clock ClkH or the low-speed clock ClkL. This scheme lacks flexibility in view of a fact that it is desired in many systems to independently select the data rate for each channel in accordance with what the channel is connected to.

Figure 8:
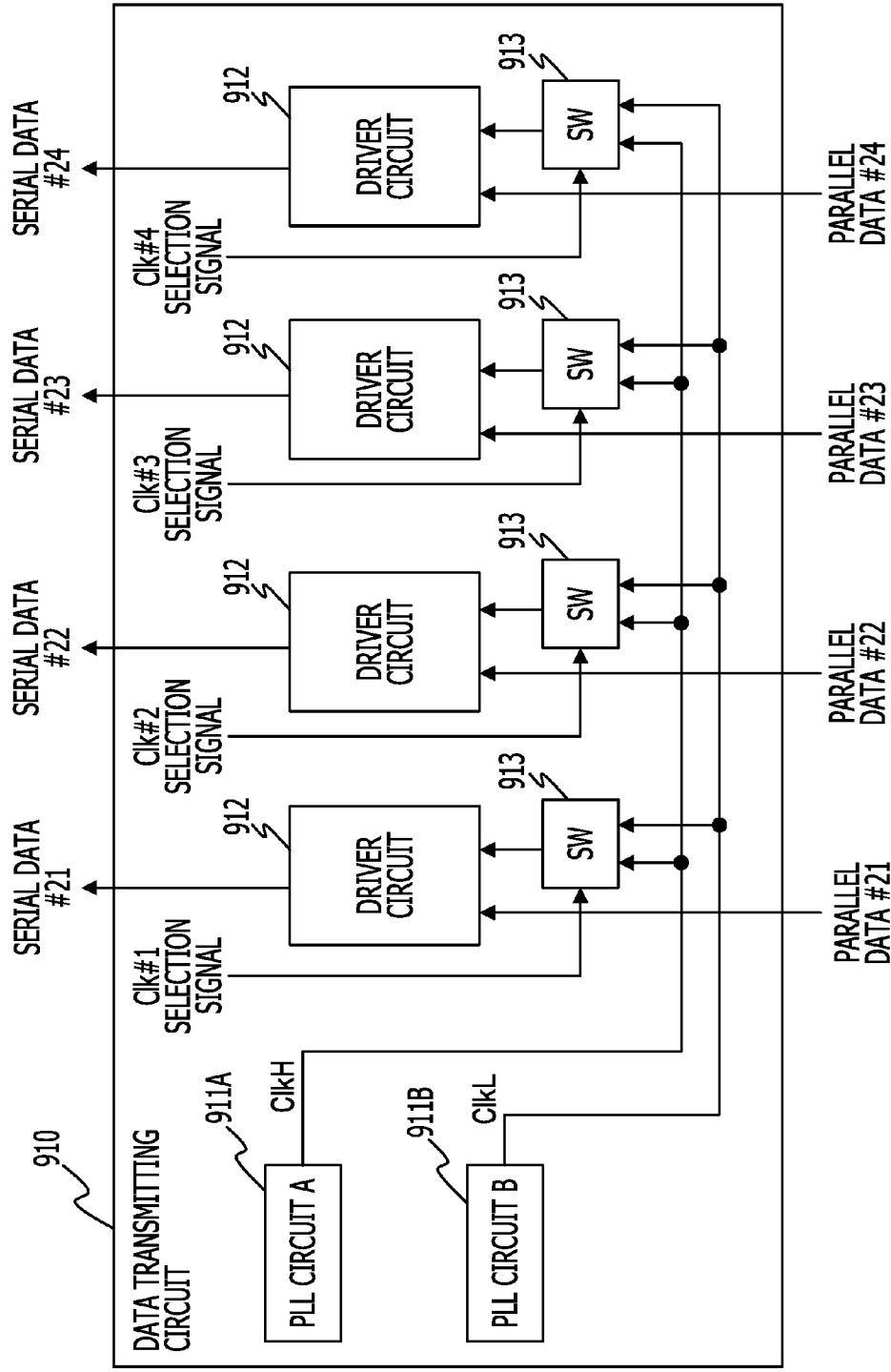
FIG. 8 illustrates an exemplary configuration of a data transmitting circuit.

A data transmitting circuit 910 illustrated in FIG. 8 includes a plurality of PLL circuits 911, a plurality of driver circuits 912, and a plurality of switching circuits (SWs) 913. The plurality of PLL circuits 911 include a PLL circuit 911A that outputs a high-speed clock ClkH and a PLL circuit 911B that outputs a low-speed clock ClkL.

The PLL circuit 911A generates a high-speed clock ClkH to transmit the generated high-speed clock ClkH to the plurality of switching circuits 913. The PLL circuit 911B generates a low-speed clock ClkL to transmit the generated low-speed clock ClkL to the plurality of switching circuits 913. As in the case of the data transmitting circuit 900 illustrated in FIG. 7 discussed above, the frequency of the high-speed clock ClkH is higher than the frequency of the low-speed clock ClkL.

The switching circuits 913 select a clock to supply to the driver circuits 912 from the plurality of input clocks. The switching circuits 913 receive the generated high-speed clock ClkH from the PLL circuit 911A and the generated low-speed clock ClkL from the PLL circuit 911B. The switching circuits 913 respectively select the high-speed clock ClkH or the low-speed clock ClkL on the basis of received clock selection signals Clk #21 to #24 to transmit the selected clock to the driver circuits 912.

The driver circuits 912 receive parallel data #21 to #24. The driver circuits 912 respectively convert the parallel data #21 to #24 into serial data #21 to #24 on the basis of the clock transmitted from the switching circuits 913.

According to the configuration described above, the data transmitting circuit 910 includes a plurality of PLL circuits 911 that supply a clock corresponding to a different data rate, and therefore the data rate can be selected independently for each channel in accordance with the clock selection signals Clk #21 to #24. This allows the data transmitting circuit 910 to convert a plurality of received parallel data #21 to #24 into serial data #21 to #24 at a data rate set for each channel.

In order to support independent transfer rates for each channel, however, the data transmitting circuit 910 illustrated in FIG. 8 requires a plurality of PLL circuits 911 that generate clocks corresponding to the different data rates. Further, in order to select and supply one of outputs of the plurality of PLL circuits 911 to the driver circuits 912 independently for each channel, the data transmitting circuit 910 requires a plurality of switching circuits 913 corresponding to each channel that switch between the output clocks of the plurality of PLL circuits 911.

Therefore, an increased proportion of the circuit area in the data transmitting circuit 910 is occupied by the PLL circuits 911, the switching circuits 913, and so forth. In addition, the plurality of PLL circuits, switching circuits, and so forth increase power consumed by the data transmitting circuit 910. Further, the use of the switching circuits which switch between the output clocks increases jitter to deteriorate the data transfer quality for serial data.

As described above, according to the background art studied by the inventor, in the case of circuitry in which a data transmitting circuit includes one PLL circuit to supply one clock, the data rate cannot be set independently for a plurality of channels. Thus, such circuitry cannot be used for an LSI circuit intended to support different data rates at the same time.

On the other hand, in the case of circuitry in which a data transmitting circuit includes a plurality of PLL circuits to supply a plurality of clocks, different data rates can be supported at the same time. However, it is found that the installation of a plurality of PLL circuits and switching circuits causes issues such as an increased proportion of the area in an LSI circuit occupied by the circuits, increased power consumption, a deteriorated data transfer quality for serial data caused by increased jitter, and so forth.

The following discloses anther embodiment.

Figure 1:
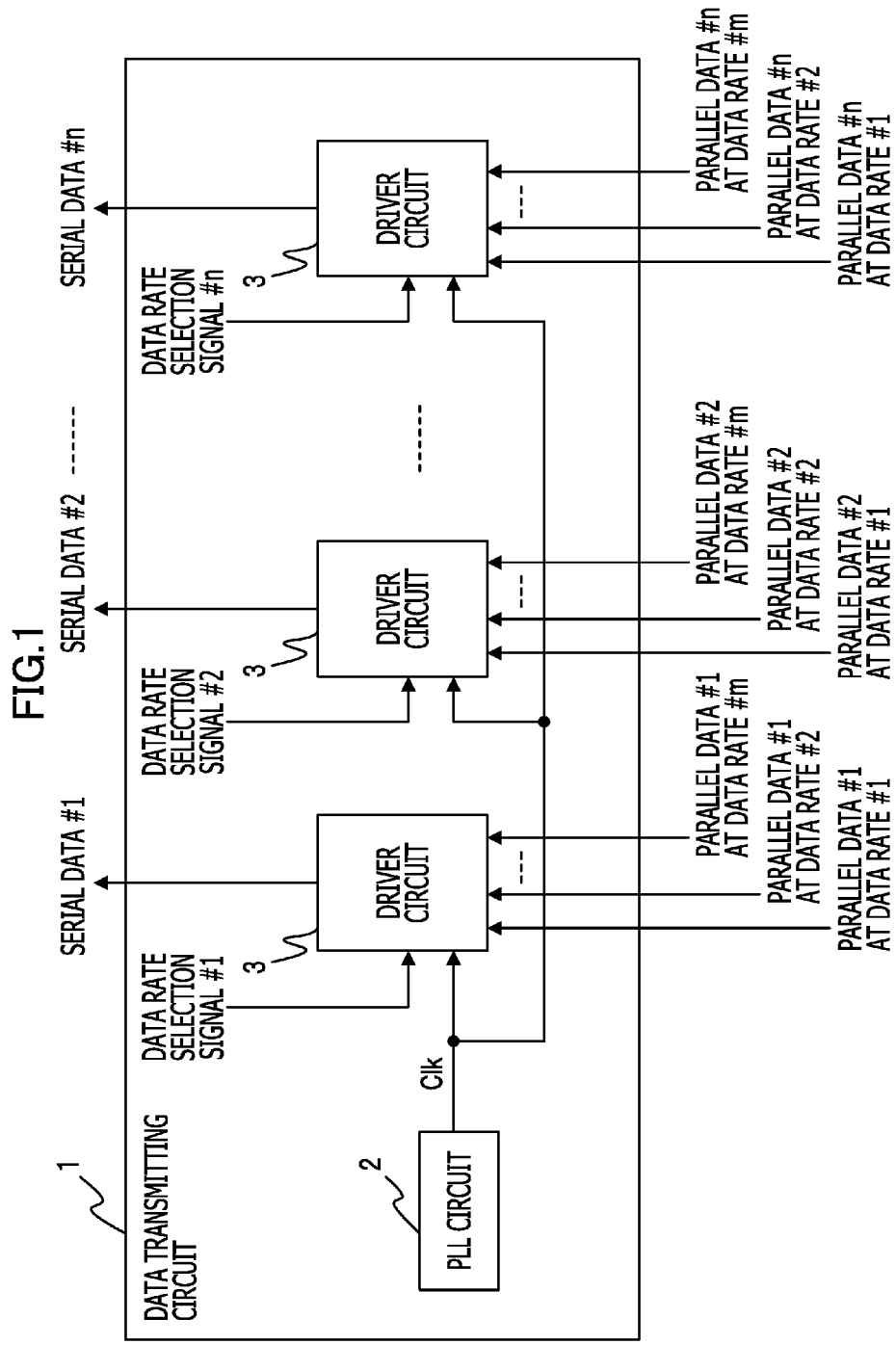
FIG. 1 illustrates an exemplary configuration of a data transmitting circuit.

FIG. 1 illustrates an exemplary configuration of a data transmitting circuit 1.

The data transmitting circuit 1 illustrated in FIG. 1 includes a plurality of channels #1 to #n (n is an integer of 2 or more), receives two or more parallel data #1 to #n (n is an integer of 2 or more) at different data rates #1 to #m (m is an integer of 2 or more) for each channel, performs a serial conversion on the received parallel data to generate serial data #1 to #n, and transmits the generated serial data #1 to #n to a data receiving circuit (not illustrated in FIG. 1).

Parallel data are data having a plurality of bits (bit width) to be transferred through a plurality of signal lines, buses, or the like, for example. The bit width of parallel data is 8 bits, 16 bits, 66 bits, or the like, for example. Serial data are data transferred via a single signal line with data for a plurality of bits transferred in a time-sharing manner, for example.

In the embodiment, the channel #1 is defined as a channel in which parallel data #1 at data rates #1 to #m are converted into serial data #1, and the same applies to the other channels #2 to #n.

The data transmitting circuit 1 illustrated in FIG. 1 includes a PLL circuit 2 and a plurality of driver circuits 3 corresponding to the channels #1 to #n.

The PLL circuit 2 provides each driver circuit 3 with a clock Clk. The clock Clk may correspond to the highest-speed data rate (which is equivalent to a first data rate and hereinafter referred to as a "high-speed data rate") for the serial data transmitted by the data transmitting circuit 1.

In the data transmitting circuit 1, the data rate #1 is the high-speed data rate, and the other data rates #2 to #m are data rates lower than the data rate #1 (which are equivalent to a second data rate and hereinafter referred to as a "low-speed data rate").

The driver circuits 3 respectively perform a serial conversion on parallel data #i (i is an integer of 1 to n) selected from the parallel data #1 to #n at the different data rates #1 to #m to generate and transmit serial data #j (j is an integer of 1 to n).

In the case where the selected parallel data #i are at the low-speed data rate, the driver circuits 3 perform data expansion on the selected parallel data #i such that the selected parallel data #i match the bit width for the high-speed data rate. Date expansion refers to increasing (expanding) the bit width of parallel data at the low-speed data rate to the bit width of parallel data at the high-speed data rate using a coding method determined in advance, for example.

Then, the driver circuits 3 perform a serial conversion on the parallel data #i which have been subjected to the data expansion on the basis of the clock Clk of the PLL circuit 2, and further perform waveform shaping on the serial data obtained as a result of the conversion, to generate serial data #j.

On the other hand, in the case where the selected parallel data #i are at the high-speed data rate, the driver circuits 3 do not perform data expansion but perform a serial conversion on the parallel data #i on the basis of the clock Clk of the PLL circuit 2 to generate serial data #j.

The driver circuits 3 may receive a data rate selection signal s which is a signal for specifying a data rate for each channel. The driver circuits 3 select parallel data #i at the specified data rate from the received parallel data #1 to #n in accordance with the data rate selection signal s. Then, the driver circuits 3 generate serial data #j to transmit the generated serial data #j to the data receiving circuit as described above.

An exemplary configuration of the driver circuit 3 according to the embodiment will be described below.

Figure 2:
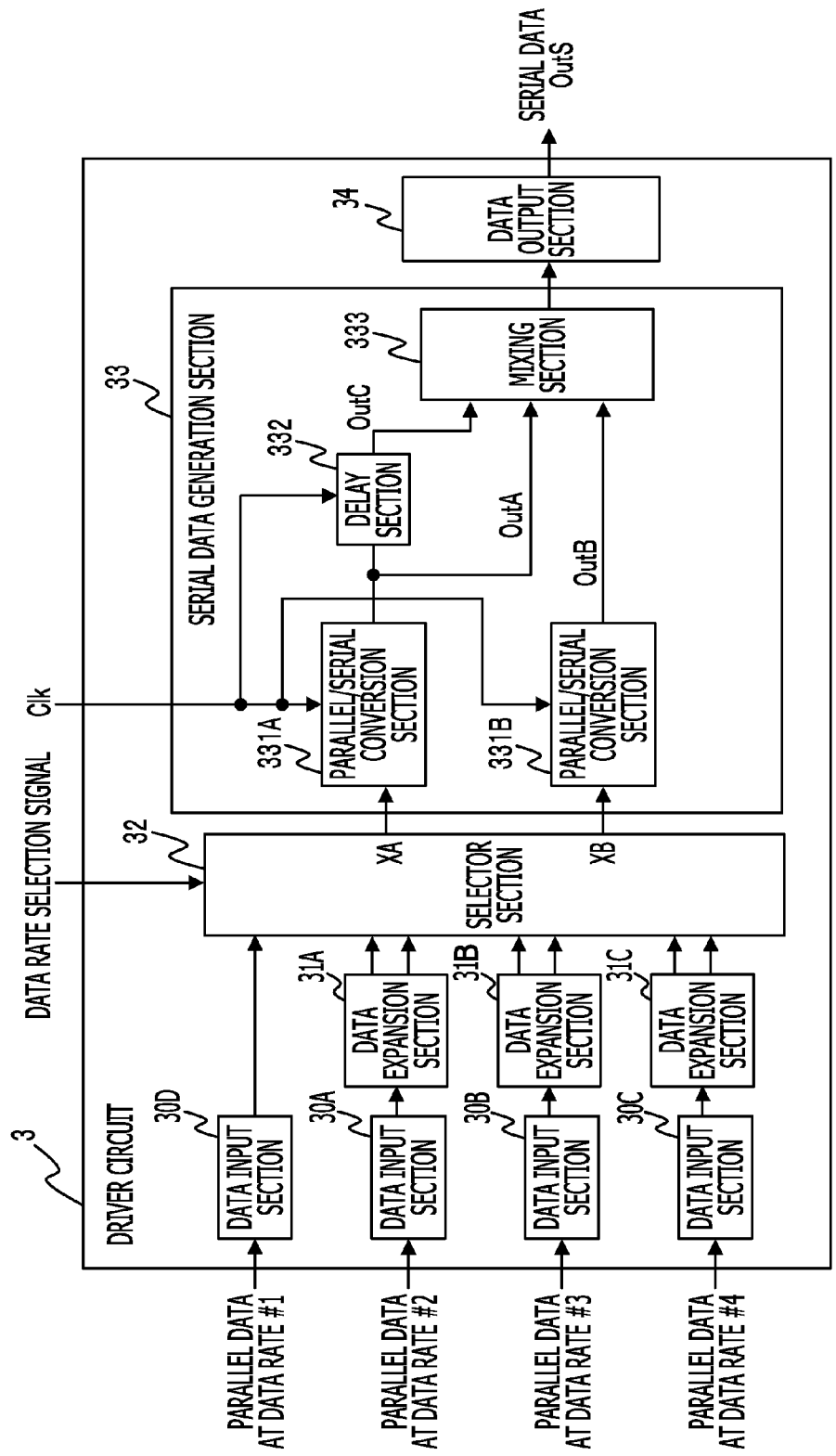
FIG. 2 illustrates an exemplary configuration of a driver circuit.

FIG. 2 illustrates an exemplary configuration of the driver circuit 3.

The driver circuit 3 illustrated in FIG. 2 includes a data input port (section) 30, a plurality of data expansion unit (sections) 31, a selector (selector section) 32, a serial data generation unit (section) 33, and a data output port (section) 34.

The serial data generation unit(section) 33 includes a plurality of parallel/serial converters (conversion sections) 331, a delay unit (section) 332, and a mixing unit (section) 333.

The data input section 30 includes at least two data input ports (sections), namely a data input port (section) that receives parallel data at the high-speed data rate, and a data input port (section) that receives parallel data at the low-speed data rate.

In the following description, the data input section 30 represents a data input section 30A, a data input section 30B, and so forth, the data expansion section 31 represents a data expansion section 31A, a data expansion section 31B, and so forth, and the parallel/serial conversion section 331 represents a parallel/serial conversion section 331A, a parallel/serial conversion section 331B, and so forth, respectively.

Of the parallel data input to the driver circuit 3 illustrated in FIG. 2, parallel data at the data rate #1 (hereinafter referred to as "parallel data #1") are parallel data at the high-speed data rate. The high-speed data rate (data rate #1) may be 10.3125 Gbps (Gigabit/sec), for example.

Parallel data at the data rates #2 to #4 (hereinafter referred to as "parallel data "#2, #3, and #4") are parallel data at the low-speed data rate. The low-speed data rate (data rate #2) may be 1.25 Gbps (Gigabit/sec), for example.

In this case, the clock Clk of the PLL circuit 2 is 10.3125 GHz, and is a clock signal for use in data expansion, a serial/parallel conversion, and so forth at 10.3125/2(=5.15625) GHz.

The data input section 30 receives parallel data input to the data transmitting circuit 1. The data input sections 30A, 30B, and 30C respectively receive parallel data #2, #3, and #4 at the low-speed data rate. The data input section 30D receives parallel data #1 at the high-speed data rate.

The parallel data #2, #3, and #4 input to the data input sections 30A, 30B, and 30C are respectively input to the data expansion sections 31A, 31B, and 31C. The parallel data #1 input to the data input section 30D are not subjected to data expansion but are directly input to the selector section 32.

The data expansion section 31 generates expanded data by expanding the parallel data (#2, #3, and #4) at the low-speed data rate so as to match the bit width (number of bits) of the parallel data (#1) at the high-speed data rate.

The data expansion section 31 generates expanded data by multiplying the number of bits of each of the parallel data #2, #3, and #4 at the low-speed data rate by an integer in such a range that the number of bits of the parallel data #1 at the high-speed data rate is not exceeded. Then, the data expansion section 31 calculates the number of deficient bits, which is the difference between the number of bits of the parallel data at the high-speed data rate and the number of bits of the generated expanded data, and generates first expanded parallel data by inserting a number of bits, the number of which corresponds to the number of deficient bits, into the generated expanded data, one each at a predetermined position, and second expanded parallel data by inserting a number of bits, the number of which corresponds to the number of deficient bits, into the generated expanded data, one each at a position different from the bit insertion position of the first expanded parallel data.

In one example, the data expansion section 31 performs data expansion by multiplying the bit width (number of bits) of the parallel data #2 at the low-speed data rate by an integer in such a range that the bit width (number of bits) of the parallel data #1 at the high-speed data rate is not exceeded. Then, the data expansion section 31 generates first expanded parallel data by inserting a number of bits, the number of which corresponds to the number of deficient bits with respect to the number of bits of the parallel data #1, into the parallel data (expanded data) obtained as a result of the data expansion, one each at a predetermined position. Further, the data expansion section 31 generates second expanded parallel data in the same way by inserting a number of bits, the number of which corresponds to the number of deficient bits, into the expanded data at a position different from the bit insertion position of the first expanded parallel data.

Specifically, in the case where the bit width of the parallel data #1 at the high-speed data rate is 66 bits and the bit width of the parallel data #2 at the low-speed data rate is 8 bits, the data expansion section 31 expands each bit of the parallel data #2 by 8 times to generate expanded data with a bit width of 64 bits (8 bits×8). Then, the data expansion section 31 adds one bit to each of the fourth and eighth 8 bits, for example, of the expanded data on the basis of the number of deficient bits, which is 2, to generate first expanded parallel data with a bit width of 66 bits. Further, the data expansion section 31 adds one bit to each of the second and sixth 8 bits, for example, of the expanded data to generate second expanded parallel data with a bit width of 66 bits.

In this way, the data expansion section 31 generates two systems of expanded parallel data with the same bit width but with a number of remainder bits inserted at different positions.

Also, in the case where the bit width of the parallel data #1 at the high-speed data rate is 64 bits and the bit width of the parallel data #2 at the low-speed data rate is 8 bits, the data expansion section 31 expands each bit of the parallel data #2 by 8 times to generate expanded data with a bit width of 64 bits (8 bits×8). Then, with no deficient bits, the data expansion section 31 transmits one piece of expanded parallel data obtained as a result of the data expansion to an input port #2B of the selector section 32 to be discussed later.

The selector section 32 includes an output port XA for input to the parallel/serial conversion section 331A of the serial data generation section 33 and an output port XB for input to the parallel/serial conversion section 331B. The selector section 32 selects an input port and an output port on the basis of a predetermined selector table to cause parallel data or expanded parallel data received from the selected input port to be transmitted from a corresponding output port.

An operation of the selector section 32 will be described in more detail below.

Figure 3:
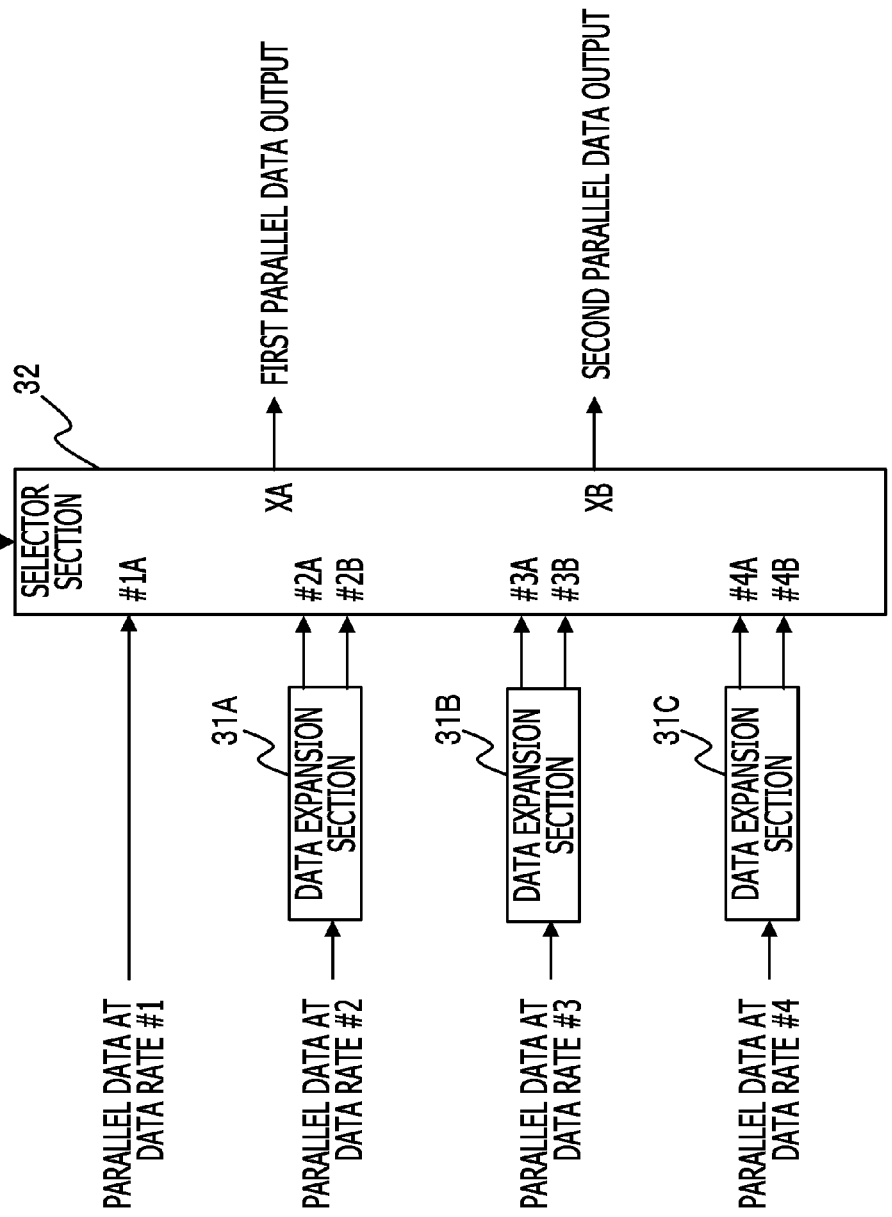
FIG. 3 illustrates an exemplary operation of a selector section.

FIG. 3 illustrates an exemplary configuration of inputs and outputs of the selector section 32.

As illustrated in FIG. 3, the selector section 32 includes an input port #1A connected to the data input section 30D, two input ports #2A and #2B connected to the data expansion section 31A, two input ports #3A and #3B connected to the data expansion section 31B, two input ports #4A and #4B connected to the data expansion section 31C, an output port XA connected to the parallel/serial conversion section 331A of the serial data generation section 33, and an output port XB connected to the parallel/serial conversion section 331B.

The selector section 32 receives a data rate selection signal s to select an input port and an output port on the basis of a predetermined selector table 321 in accordance with the received data rate selection signal s.

The data rate selection signal s is set in advance in correspondence with the data rate of the parallel data input to the data transmitting circuit 1.

FIG. 4 shows an exemplary selector table.

The selector table 321 stores the correspondence between the input ports #1 to #4 and the output ports XA and XB for parallel data received by the selector section 32 illustrated in FIG. 3 for each data rate.

In the selector table 321, it is shown that when the selector section 32 receives a data rate selection signal "00", parallel data at the data rate #1 are to be processed so that data input from the input port #1A are output from the output port XB to be transmitted to the parallel/serial conversion section 331B of the serial data generation section 33 but that the output port XA constantly outputs "0" because no input port #1B is provided.

Also, it is shown that when the selector section 32 receives a data rate selection signal "01", parallel data at the data rate #2 (low-speed data rate) are to be processed so that data input from the input port #2A are output from the output port XA to be transmitted to the parallel/serial conversion section 331A of the serial data generation section 33 and that data input from the input port #2B are output from the output port XB to be transmitted to the parallel/serial conversion section 331B of the serial data generation section 33.

Likewise, it is shown that when the selector section 32 receives a data rate selection signal "10", parallel data at the data rate #3 (low-speed data rate) are to be processed so that data input from the input port #3A are output from the output port XA to be transmitted to the parallel/serial conversion section 331A and that data input from the input port #3B are output from the output port XB to be transmitted to the parallel/serial conversion section 331B.

Further, likewise, it is shown that when the selector section 32 receives a data rate selection signal "11", parallel data at the data rate #4 (low-speed data rate) are to be processed so that data input from the input port #4A are output from the output port XA to be transmitted to the parallel/serial conversion section 331A and that data input from the input port #4B are output from the output port XB to be transmitted to the parallel/serial conversion section 331B.

For example, when the data rate selection signal "00" is received, the selector section 32 references the selector table 321 and determines that the data rate is the "data rate #1 (high-speed data rate)" to select the input port #1A and the output port XB corresponding to the "data rate #1". Consequently, the selector section 32 receives the parallel data #1 from the input port #1B and transmits the received parallel data #1 from the output port XB to the parallel/serial conversion section 331B of the serial data generation section 33.

Also, when the data rate selection signal "01" is received, the selector section 32 references the selector table 321 and determines that the data rate is the "data rate #2 (low-speed data rate)", and receives the first expanded parallel data transmitted from the data expansion section 31A from the input port #2A and transmits the received first expanded parallel data from the output port XA to the parallel/serial conversion section 331A of the serial data generation section 33.

Further, the selector section 32 receives the second expanded parallel data transmitted from the data expansion section 31A from the input port #2B and transmits the received second expanded parallel data from the output port XB to the parallel/serial conversion section 331B of the serial data generation section 33.

In the case where the data expansion section 31A generates only one piece of expanded parallel data at the data rate #2, the data rate selection signal "01" is received. The selector section 32 receives the expanded parallel data transmitted from the data expansion section 31A only from the input port #2B and transmits the received expanded parallel data from the output port XB to the parallel/serial conversion section 331B of the serial data generation section 33. In this case, the input port #2A is connected to a GND level, for example, so that the output port XA also makes a signal at the GND level.

The serial data generation section 33 converts the parallel data or the expanded parallel data received from the selector section 32 into serial conversion data with reference to the clock Clk of the PLL circuit 2.

The parallel/serial conversion section 331A of the serial data generation section 33 receives the second expanded parallel data from the output port XA of the selector section 32 and performs a serial conversion on the received second expanded parallel data with reference to the clock Clk to transmit serial data OutA obtained as a result of the conversion to the delay section 332 and the mixing section 333.

The parallel/serial conversion section 331B receives the first parallel data or the first expanded parallel data from the output port XB of the selector section 32 and performs a serial conversion on the received first parallel data or first expanded parallel data with reference to the clock Clk to transmit serial data OutB obtained as a result of the conversion to the mixing section 333.

The delay section 332 generates serial data OutC by delaying the input serial data OutA by one cycle of a clock serving as the reference for the high-speed data rate to transmit the generated serial data OutC to the mixing section 333.

The clock serving as the reference for the high-speed data rate, namely the clock Clk, is a clock for generating serial data at 10.3125 Gbps. In a typical circuit, a clock of 5.15626 GHz is used.

The mixing section 333 generates serial data OutS for output by performing voltage addition, for example, on signals corresponding to the received serial data OutA, OutB, and OutC and performing waveform shaping on the signal obtained as a result of the voltage addition to transmit the generated serial data OutS to the data output section 34.

The data output section 34 transmits the generated serial data OutS to a receiving circuit (not illustrated). The serial data OutS obtained as a result of conversion from the parallel data #1 are equivalent to the first serial data, and the serial data OutS obtained as a result of conversion from any of the parallel data #2 to #4 are equivalent to the second serial data.

An operation of the data transmitting circuit 1 according to an embodiment will be described more specifically below with reference to FIG. 5.

Figure 5:
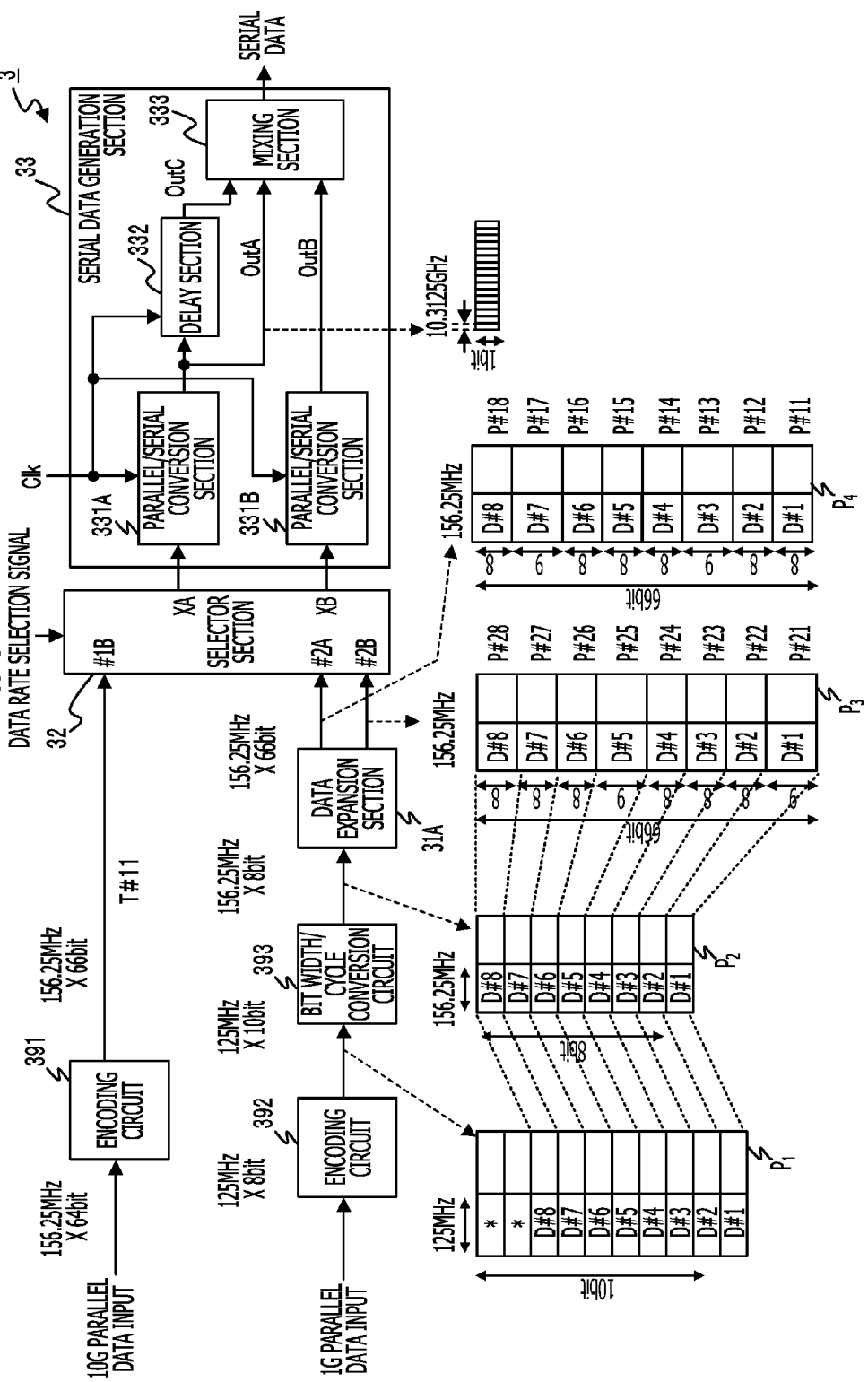
FIG. 5 illustrates an exemplary operation of the driver circuit.

In the embodiment, the data transmitting circuit 1 including the driver circuit 3 illustrated in FIG. 5 uses a high-speed data rate of 10.3125 Gbps and a low-speed data rate of 1.25 Gbps.

The driver circuit 3 illustrated in FIG. 5 includes data input sections 30A and 30D, a data expansion section 31A, a selector section 32, a serial data generation section 33, a data output section 34, and known circuits for encoding and cycle conversion processes. The data input sections 30A and 30D, the data expansion section 31A, the selector section 32, the serial data generation section 33, and the data output section 34 are equivalent to the processing sections with the same reference numerals illustrated in FIG. 2. It should be noted that the data input sections 30A and 30D and the data output section 34 are not illustrated in FIG. 5.

The data expansion section 31A performs data expansion on the input parallel data with a bit width of 8 bits to generate expanded parallel data with a bit width of 66 bits.

An encoding circuit 391 converts parallel data (10 G parallel data) with a bit width of 64 bits and synchronized with a clock of 156.25 MHz input by the data input section 30D of the driver circuit 3 into parallel data with a bit width of 66 bits.

An encoding circuit 392 converts parallel data (1 G parallel data) with a bit width of 8 bits and synchronized with a clock of 125 MHz input by the data input section 30A of the driver circuit 3 into parallel data with a bit width of 10 bits.

A bit width/cycle conversion circuit 393 converts the parallel data with a bit width of 10 bits and synchronized with a clock of 125 MHz so as to match a clock cycle of 156.25 MHz and then to match a bit width of 8 bits.

A process performed in the case where the low-speed data rate is selected in the driver circuit 3 of FIG. 5 will be described.

Process Step ST1: The data input section 30A of the data transmitting circuit 1 receives parallel data $P_0$(D#1 to D#8) with a bit width of 8 bits and synchronized with a clock of 125 MHz.

Process Step ST2: The encoding circuit 392 converts the parallel data $P_0$(D#1 to D#8) received by the data input section 30A into parallel data $P_1$ (D#1 to D#10) with a bit width of 10 bits and synchronized with a clock of 125 MHz.

The encoding circuit 392 generates parallel data with a bit width of 10 bits by adding two bits (*) to the parallel data $P_0$ (D#1 to D#8), for example, to transmit the generated parallel data $P_1$(D#1 to D#10) to the bit width/cycle conversion circuit 393.

In the width of bits D#1 to D#8 of the 1 G parallel data (parallel data with a bit width of 8 bits and synchronized with a clock of 125 MHz), the bit D#1 is the most significant bit, the bits D#i (i is an integer) are bits sequentially lower in the order of the number i, and the bit D#8 is the least significant bit in the case of a bit width of 8 bits.

Process Step ST2: When the parallel data $P_1$(D#1 to D#10) of 125 MHz/10 bits transmitted from the encoding circuit 392 are received, the bit width/cycle conversion circuit 393 converts the clock cycle to 156.25 MHz and further converts the bit width to 8 bits to obtain parallel data $P_2$(D#1 to D#8). The bit width/cycle conversion circuit 393 transmits the parallel data $P_2$(D#1 to D#8) of 156.25 MHz/8 bits obtained as a result of the conversion to the data expansion section 31A.

A clock obtained by dividing the frequency of the clock Clk (10.3125 GHz/2) by 33 is used as the clock of 156.25 MHz, but a frequency divider circuit, a supply circuit, and so forth for use in the frequency division are not illustrated in the drawing.

Process Step ST3: The data expansion section 31A performs 8:66-bit data expansion on the parallel data $P_2$(D#1 to D#8) received from the bit width/cycle conversion circuit 393 to generate two systems of first expanded parallel data $P_3$(P#11 to P#18) and second expanded parallel data $P_4$(P#21 to P#28) with a bit width of 66 bits and synchronized with a clock of 156.25 MHz.

Specifically, the data expansion section 31A performs data expansion on the parallel data $P_0$(D#1 to D#8) with a bit width of 8 bits by an integer ratio of 8:64 into parallel data with a bit width of 64 bits (8 bits D#1 to 8 bits D#8).

Next, the data expansion section 31A inserts two bits, which correspond to the number of deficient bits, into the expanded data with a bit width of 64 bits obtained as a result of the data expansion. Specifically, the data expansion section 31A inserts one bit into each of D#3 and D#7, of D#1 to D#8 of the parallel data (expanded data) obtained as a result of the data expansion, to generate first expanded parallel data $P_3$(P#11 to P#18). As a result, P#13 (bits D#3) and P#17 (bits D#7) of the first expanded parallel data $P_3$ have nine bits.

Further, the data expansion section 31A inserts one bit into each of D#1 and D#5, of D#1 to D#8 of the parallel data obtained as a result of the data expansion, to generate second expanded parallel data $P_4$(P#21 to P#28). P#21 (bits D#1) and P#25 (bits D#5) of the second expanded parallel data $P_4$ have nine bits.

In the manner described above, the 1 G parallel data input provides two systems of parallel data $P_3$ and $P_4$ corresponding to the high-speed data rate (10.3125 GHz).

Process Step ST4: The data expansion section 31A transmits the first expanded parallel data $P_3$, of the two systems of expanded parallel data $P_3$ and $P_4$ with a bit width of 66 bits and at a clock of 156.25 MHz, to the input port #2A of the selector section 32, and transmits the second expanded parallel data $P_4$ to the input port #2B of the selector section 32.

Process Step ST5: In response to the data rate selection signal "01" for selecting the low-speed data rate, the selector section 32 selects and receives the first expanded parallel data $P_3$ from the input port #2A to transmit the first expanded parallel data $P_3$ from the output port XA to the parallel/serial conversion section 331A. Also, the selector section 32 selects and receives the second expanded parallel data $P_4$ from the input port #2B to transmit the second expanded parallel data $P_4$ from the output port XB to the parallel/serial conversion section 331B.

Process Step ST6: When the first expanded parallel data $P_3$ are received from the selector section 32, the parallel/serial conversion section 331A performs a serial conversion on the received first expanded parallel data $P_3$ on the basis of the clock Clk to generate serial data OutA.

Further, the parallel/serial conversion section 331A transmits the serial data OutA obtained as a result of the conversion to the delay section 332 and the mixing section 333.

Process Step ST7: When the serial data OutA are received, the delay section 332 delays the received serial data OutA by a unit interval (1 UI) corresponding to one cycle of the clock to transmit serial data OutC obtained as a result of the delay to the mixing section 33.

Process Step ST8: When the second expanded parallel data $P_4$ are received from the selector section 32, the parallel/serial conversion section 331B performs a serial conversion on the received second expanded parallel data $P_4$ on the basis of the clock Clk to generate serial data OutB, and transmits the generated serial data OutB to the mixing section 333.

Process Step ST9: When the three serial data OutA, OutB, and OutC are received, the mixing section 333 mixes the received serial data to generate serial data OutS for output. The details of the serial data mixing process performed by the mixing section 333 will be discussed later.

Process Step ST10: The data output section 34 transmits the received serial data OutS to a data receiving circuit.

Figure 6:
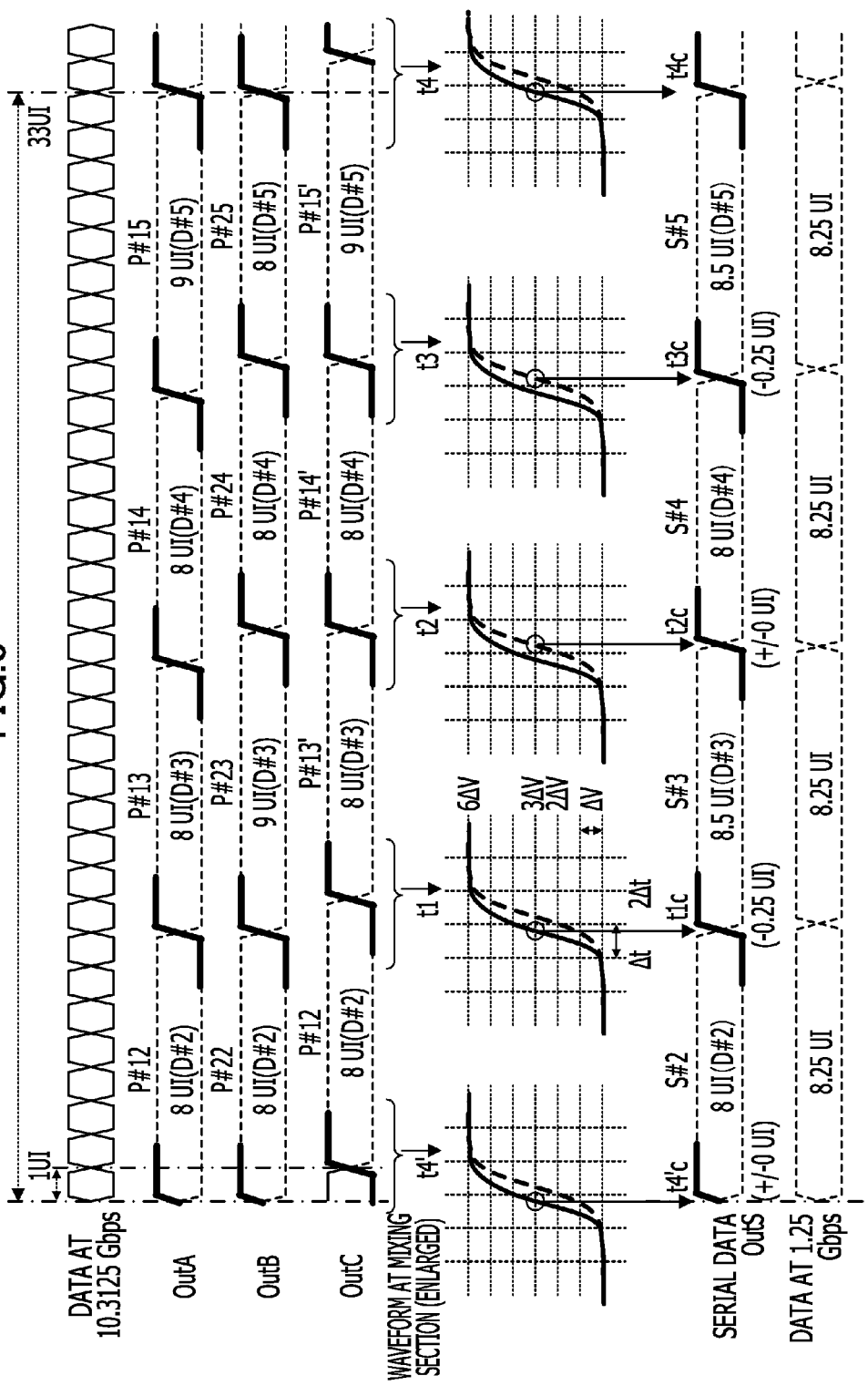
FIG. 6 illustrates an exemplary operation of a serial data generation section.

FIG. 6 illustrates an operation of the mixing section 333 of the serial data generation section 33.

In FIG. 6, the horizontal axis (not illustrated) and the vertical axis (not illustrated), which serve as the references of waveforms, represent the time and the voltage value, respectively, and the waveforms of the serial data OutA to OutC for input and output and the waveform of the serial data OutS for output illustrated in FIG. 5 are illustrated.

Also, the waveform of data at 10.3125 Gbps and the waveform of data at 1.25 Gbps are shown as reference waveforms.

Defining one cycle (96.9696 picoseconds) of a high-speed data rate transfer clock of 10.3125 GHz synchronized with the clock Clk as 1 UI (Unit Interval), the reference waveform of the data at 10.3125 Gbps shows changes in data for each UI, and a waveform showing data for a period of 33 UI is indicated by a broken arrow.

In FIG. 6, the other waveforms are also shown using 1 UI, which corresponds to one cycle of a clock of 10.3125 GHz, as the reference. For example, the waveform of the data at 1.25 Gbps is shown such that data for a period of one cycle of a clock of 1.25 GHz correspond to 8.25 UI.

The waveforms indicated as timing t4' and timings t1 to t4 are each an enlarged waveform showing the course of generating serial data around the indicated time, and therefore are different from the other waveforms in terms of the scale ratios of the horizontal axis and the vertical axis.

The waveforms of the serial data OutA and the serial data OutB illustrated in FIG. 6 are respectively exemplary waveforms of the first expanded parallel data $P_3$ (P#11 to P#18) and the second expanded parallel data $P_4$(P#21 to P#28) illustrated in FIG. 5 after being output from the parallel/serial conversion sections 331A and 331B.

For example, in the waveform of the serial data OutA, data P#12, P#13, and P#14 respectively include the bits D#2, D#3, and D#4 continued for a period of 8 UI, and data P#15 include the bits D#5 continued for a period of 9 UI.

Also, in the waveform of the serial data OutB, data P#12, P#14, and P#15 respectively include the bits D#2, D#4, and D#5 continued for a period of 8 UI, and data P#13 include the bits D#3 continued for a period of 9 UI.

Although not illustrated in FIGS. 6, P#11 and P#16 to P#18 of the first expanded parallel data $P_3$ and P#21 and P#26 to P#28 of the second expanded parallel data $P_4$ also have the same relationship as described above.

The waveform of the serial data OutC illustrated in FIG. 6 corresponds to the output of the delay section 332 which delays the serial data OutA by 1 UI, and therefore is obtained by delaying the waveform of the serial data OutA by 1 UI.

P#12' to P#15' of the serial data OutC are obtained by delaying P#12 to P#15 of the first expanded parallel data $P_3$ by 1 UI.

The serial data OutA to OutC described above are input to the mixing section 333.

In the waveforms indicated as timing t4' and timings t1 to t4, one span along the horizontal axis between dotted grid lines corresponds to a time width $\Delta t$, and one span along the vertical axis between dotted grid lines corresponds to a voltage width $\Delta V$. For example, the time width $\Delta t$ is equal to 1 UI, and the voltage width $\Delta V$ is equal to 0.5 Vop. Vop means a voltage amplitude value of the serial data OutA, OutB, and so forth.

The mixing section 333 mixes the serial data OutA, OutB, and OutC by performing a voltage addition on signals for the serial data to generate a mixed waveform mix described below.

The mixed waveform mix is the waveform of a signal obtained in the course of the mixing section 333 generating serial data. That is, the mixed waveform mix is the waveform of a signal before being subjected to waveform shaping performed by the mixing section 333 using a threshold Vth.

At timing t1 of FIG. 6, in the case where the voltage rise time of the mixed waveform mix obtained as a result of the voltage addition described above is defined as time t=0 and a voltage value V=0, the mixed waveform mix rises to a voltage value V=4 $\Delta V$ at time $\Delta t$. This is ascribable to rises in the voltage waveforms of the serial conversion data OutA and OutB. Then, the mixed waveform mix rises to a voltage value V=4 $\Delta V$ to 6 $\Delta V$ at time t=$\Delta t$ to 2 $\Delta t$.

The mixing section 333 performs waveform shaping on the mixed waveform mix on the basis of the threshold Vth determined in advance.

For example, the point of change from S#2 to S#3 in the serial data OutS output from the mixing section 333 in the case where the threshold Vth is determined to be equal to 3 $\Delta V$ is represented by a circular mark on the mixed waveform mix at timing t1 illustrated in FIG. 6. The time width from the voltage rise time of the mixed waveform mix, namely time t=0, to the point of change to S#3 in the serial data OutS is defined as t1$c$.

When the time width t1$c$ of the data change point is calculated approximately with the threshold Vth=t1$c$×(4$\Delta V$/$\Delta t$), the time width t1$c$ is obtained as t1$c$=(¾)$\Delta t$=0.75 $\Delta t$=0.75 UI. In the same way, the time width t2$c$ of the data change point at timing t2 is obtained as t2$c$=(5/4)$\Delta t$=1.25 $\Delta t$=1.25 UI.

Thus, the period of S#3 in the serial data OutS which have been subjected to the waveform shaping is obtained, for example from FIG. 6, as follows. That is, the period of S#3 in the serial data OutS includes a period in which the voltage value exceeds the threshold Vth at timing t1, (2−t1$c$)UI=1.25 UI, a period in which the voltage value becomes the threshold Vth or less at timing t2, t2$c$=1.25 UI, and the remaining period, 6 UI. Consequently, the period of S#3 in the serial data OutS is equal to 1.25 UI+1.25 UI+6 UI=8.5 UI.

Likewise, the time width t3$c$ of the data change point at next timing t3 is obtained as t3$c$=(5/4)$\Delta t$=1.25 UI. The time width t4$c$ of the data change point at timing t4 is obtained as t4$c$=(¾)$\Delta t$=0.75 UI. The time width t4'$c$ of the data change point at timing t4' is obtained as t4'$c$=0.75 UI. Thus, the period of S#4 in the serial data OutS is equal to 8.0 UI.

In the same way as described above, the period of S#5 in the serial data OutS is equal to 8.5 UI, and the period of S#2 in the serial data OutS is equal to 8.0 UI as with S#4.

The reference waveform of the data at 1.25 Gbps is provided for comparison with the waveform of the serial data OutS, and shows a waveform obtained in the case where the jitter in the 1 G Ethernet standard (IEEE 802.3) is 0 UI. In this case, the jitter of the serial data OutS around timing t4'$c$ is ±0 UI. Likewise, the jitter of the serial data OutS around timing t1$c$ is −0.25 UI. The jitter of the serial data OutS at the other timings are as illustrated in FIG. 6.

The jitter tolerance in the 1 G Ethernet standard is 0.09 UI/1 UI. Thus, when converted in terms of 8.25 UI, the jitter tolerance for 8.25 UI is obtained as 8.25 UI×0.09 UI/1 UI=0.7425UI. Meanwhile, when the waveform of the serial data OutS illustrated in FIG. 6 is compared with the waveform of the data at 1.25 Gbps in terms of the data change points, the jitter of the serial data OutS is 0.25 UI or less.

In the case where the serial data OutA or OutB from the parallel/serial conversion section 331 were simply serial data, the jitter of the serial data would be 0.75 UI. According to the data transmitting circuit 1, however, the jitter of the serial data OutS transmitted from the mixing section 333 to a data receiving circuit can be as low as 0.25 UI or less.

That is, in the case where data at the low-speed data rate are transferred as data at the high-speed data rate that is not an integer number of times the low-speed data rate, the processes performed by the data expansion section 31 and the serial data generation section 33 have the effect of reducing the jitter of serial data. The flow of the jitter reduction process discussed above can be described briefly as follows.

(1) The serial data OutC has a waveform obtained by delaying the waveform of the serial data OutA by 1 UI. That is, the data change points (edges) of all the bits D#1 to D#8 are shifted by 1 UI between each other.

(2) The serial data OutB have bits corresponding to the deficient bits inserted by the data expansion section 31 at different positions from the positions of the bits inserted into the serial data OutA, and therefore have a number of data change points shifted by 1 UI from the data change points in the serial data OutA, the number of which corresponds to the number of bits D#i (i is an integer of 1 to 8) for which bits corresponding to the deficient bits are inserted. Also, the serial data OutC and the serial data OutB have a number of data change points shifted by 1 UI between each other, the number of which corresponds to the number of bits D#i for which bits corresponding to the deficient bits are not inserted.

(3) The signal of the serial data OutC coincides with the signal of either the serial data OutA or the serial data OutB in terms of waveform edges. That is, the rising (or falling) edges of the waveforms of two of the serial data OutA to OutC coincide with each other, and the rising (or falling) edges of the remaining waveform are shifted by 1 UI.

(4) The mixing section 333 adds the signals of the serial data OutA to OutC, and performs waveform shaping on the signal (mixed waveform mix) obtained as a result of the addition. As a result of the waveform shaping performed by the mixing section 333, the data change points determined in advance can be shifted by about 0.5 bits to generate serial data OutS. The mixing section 333 transmits the generated serial data OutS to the data output section 34.

In the case where data at the high-speed data rate are input, the driver circuit 3 illustrated in FIG. 2 operates as follows.

Process Step ST11: The data input section 30D receives 10 G parallel data of 64 bits/156.25 MHz to transmit the received data to the encoding circuit 391.

Process Step ST12: The encoding circuit 391 codes the 10 G parallel data received from the data input section 30D, generates parallel data with a bit width of 66 bits by adding two control bits to the coded data, and transmit the generated 10 G parallel data of 66 bits/156.25 MHz to the input port #1B of the selector section 32.

Process Step ST13: The selector section 32 references the predetermined selector table 321, receives the 10 G parallel data with a bit width of 66 bits from the input port #1B, and transmits the 10 G parallel data received from the output port XB to the parallel/serial conversion section 331B of the serial data generation section 33.

Process Step ST14: The parallel/serial conversion section 331B performs a serial conversion on the received 10 G parallel data to transmit the serial data OutB obtained as a result of the conversion to the mixing section 333.

Process Step ST15: The mixing section 333 transmits the received serial data OutB as they are to the data output section 34 as the serial data OutS.

Process Step ST16: The data output section 34 transmits the received serial data OutS to a data receiving circuit.

According to the driver circuit 3 of the disclosed data transmitting circuit 1, the bit width of data at a low-speed data rate is expanded to the bit width of data at a high-speed data rate on the basis of the clock Clk of one PLL circuit 2. For this purpose, in the case where the bit width of the data at the high-speed data rate is not an integer number of times the bit width of the data at the low-speed data rate, the driver circuit 3 performs data expansion on the data at the low-speed data rate by an integer number of times such that the bit width of the data at the high-speed data rate is not exceeded, and then inserts a number of bits, the number of which corresponds to the number of deficient bits with respect to the bit width of the data at the high-speed data rate, into the data at the low-speed data rate at positions determined in advance, to generate first and second parallel data. The driver circuit 3 performs a parallel/serial conversion on the first and second parallel data, and performs a computation on the basis of signals of the data obtained as a result of the conversion and a signal of data obtained by delaying the data obtained as a result of the conversion by one bit, and performs waveform shaping on the data obtained as a result of the computation to generate serial data.

As described above, according to the disclosed data transmitting circuit 1, the data rate can be set independently for a plurality of driver circuits 3 with one PLL circuit 2. As a result, the clock Clk is supplied by one PLL circuit 2, and therefore the proportion of the area occupied by a PLL circuit, a switching circuit, and so forth can be reduced as much as possible.

Also, by reducing the number of PLL circuits, switching circuits, and so forth as much as possible, power consumption can be reduced. Further, it is not necessary to switch between a plurality of clocks, and therefore a switching circuit that switches between the clocks is not used. Therefore, deterioration in data quality of serial data can be suppressed as much as possible without increasing the jitter of serial data transmitted from the data transmitting circuit 1 to a data receiving circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A circuit that converts parallel data into serial data to output the serial data, the circuit comprising:
    a first data input port that receives first parallel data at a first data rate based on a reference input clock;
    a second data input port that receives second parallel data at a second data rate lower than the first data rate of the reference input clock;
    a data expansion unit that generates expanded data by expanding a bit number of the second parallel data to a bit number of the first parallel data when the second parallel data is selected;
    a serial data generation unit that performs a process of generating first serial data by performing a serial conversion on the first parallel data based on the reference input clock when the second parallel data is selected, and a process of generating second serial data by performing a serial conversion on the expanded data based on the reference input clock when the first parallel data is selected; and
    a data output port that outputs the first serial data or the second serial data.

2. The data transmitting circuit according to claim 1, wherein the data expansion unit performs
- a process of generating expanded data by multiplying the bit number of the second parallel data by an integer in such a range that the bit number of the first parallel data is not exceeded, and
- a process of calculating a number of deficient bits, which is a difference between the bit number of the first parallel data and the bit number of the expanded data, and generating first expanded parallel data by inserting a number of bits, the number of which corresponds to the number of deficient bits, into the expanded data, one each at a predetermined position, and second expanded parallel data by inserting a number of bits, the number of which corresponds to the number of deficient bits, into the expanded data, one each at a position other than the predetermined position, and the serial data generation unit performs
- a process of generating first expanded serial data and second expanded serial data by respectively performing a serial conversion on the first expanded parallel data and the second expanded parallel data,
- a process of delaying a signal of the first expanded serial data by one unit cycle, and
- a process of generating the second serial data by mixing the signal of the first expanded serial data, a signal of the second expanded serial data, and a delayed version of the signal of the first expanded serial data.

3. The data transmitting circuit according to claim 1, further comprising:
- one or more additional second data input ports, each of the second data input ports receiving second parallel data corresponding to a data rate based on a different clock; and
- a selector section that selects, from the plurality of second data input ports, a second data input section that receives second parallel data to be input to the serial data generation unit.

4. A method, comprising:

receiving first parallel data at a first data rate based on a reference input clock;

receiving second parallel data at a second data rate lower than the first data ate of the reference input clock;

generating expanded data by expanding a bit number of the second parallel data to a bit number of the first parallel data and generating second serial data by a parallel to serial converter that performs a serial conversion on the expanded data based on the reference input clock when the second parallel data is selected, and generating first serial data by a parallel to serial converter that performs a serial conversion on the first parallel data based on the reference input clock when the first parallel data is selected; and outputting the first serial data or the second serial data.

* * * * *

UNITED STATES PATENT AND TRADEMARK OFFICE
CERTIFICATE OF CORRECTION

PATENT NO. : 8,102,288 B2
APPLICATION NO. : 12/818786
DATED : January 24, 2012
INVENTOR(S) : Yoichi Koyanagi It is certified that error appears in the above-identified patent and that said Letters Patent is hereby corrected as shown below:

Column 16, Line 15, in Claim 4, delete "data ate" and insert -- data rate --, therefor.

Signed and Sealed this
Tenth Day of April, 2012

David J. Kappos
*Director of the United States Patent and Trademark Office*